(12) United States Patent
Joukou et al.

(10) Patent No.: US 7,619,503 B2
(45) Date of Patent: Nov. 17, 2009

(54) POWER SEMICONDUCTOR APPARATUS PROVIDED WITH POWER CONTROLLING SEMICONDUCTOR MODULES CONNECTED IN PARALLEL TO EACH OTHER

(75) Inventors: Motonobu Joukou, Tokyo (JP); Masanori Fukunaga, Tokyo (JP); Nobutake Taniguchi, Tokyo (JP); Takahiro Inoue, Tokyo (JP); Nobuya Nishida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 437 days.

(21) Appl. No.: 11/336,991

(22) Filed: Jan. 23, 2006

(65) Prior Publication Data
US 2006/0193091 A1 Aug. 31, 2006

(30) Foreign Application Priority Data
Feb. 25, 2005 (JP) ............................. 2005-050781

(51) Int. Cl.
*G05B 23/02* (2006.01)
(52) U.S. Cl. .................. 340/3.71; 340/825.36; 700/17; 345/168; 708/139
(58) Field of Classification Search .................. 700/17; 340/3.71, 825, 36; 345/168; 708/139
See application file for complete search history.

(56) References Cited

U.S. PATENT DOCUMENTS 5,400,246 A * 3/1995 Wilson et al. ................. 700/17

6,208,041 B1 3/2001 Majumdar et al.
6,583,976 B1 6/2003 Murahashi et al.

FOREIGN PATENT DOCUMENTS

| JP | 8-213890 | 8/1996 |
|---|---|---|
| JP | 10-14215 | 1/1998 |
| JP | 10-42548 | 2/1998 |
| JP | 2000-92820 | 3/2000 |
| JP | 2002-369496 | 12/2002 |
| JP | 2002-369497 | 12/2002 |
| WO | WO 01/89090 | 11/2001 |

* cited by examiner

*Primary Examiner*—Michael B Shingleton
(74) *Attorney, Agent, or Firm*—Oblon, Spivak, McClelland, Maier & Neustadt, L.L.P.

(57) ABSTRACT

A power semiconductor apparatus is provided with power controlling semiconductor modules connected in parallel to each other. Each power controlling semiconductor module controls driving of a power semiconductor device. The power semiconductor apparatus includes a transmission circuit and a reception circuit provided in one and another power controlling semiconductor modules, respectively. The transmission circuit transmits a predetermined communication signal to another power controlling semiconductor module based on a predetermined activation signal generated by one power controlling semiconductor module. The reception circuit receives the transmitted communication signal, and controls driving control operation of another power controlling semiconductor module based on the received communication signal.

4 Claims, 9 Drawing Sheets

Fig.1 FIRST PREFERRED EMBODIMENT

| PROTECTION ALARM SIGNAL | ERROR MODE SIGNAL EM | |
|---|---|---|
| | em1 | em2 |
| NONE (NORMAL) | 0 | 0 |
| FE1 (UV) | 0 | 1 |
| FE2 (OC) | 1 | 0 |
| FE3 (SC) | 1 | 1 |
| FE4 (OT) | 1 | OSCILLATION SIGNAL |

Fig.6

| STATUS | COMMUNICATION ERROR SIGNAL | | COMMUNICATION ERROR SIGNAL | |
|---|---|---|---|---|
| | FA1 | FA2 | FB1 | FB2 |
| NORMAL | 0 | 0 | 0 | 0 |
| ERROR SIGNAL EC IS GENERATED BY IPM3-2 | 0 | 1 | 1 | 0 |
| ERROR SIGNAL EC IS GENERATED BY IPM3-1 | 1 | 0 | 0 | 1 |
| CABLE CA1 IS DISCONNECTED | 1 | 0 | 0 | 1 |
| CABLE CA2 IS DISCONNECTED | 0 | 1 | 1 | 0 |

Fig.8

| STATUS | COMMUNICATION ERROR SIGNAL | | | COMMUNICATION ERROR SIGNAL | | |
|---|---|---|---|---|---|---|
| | FA1 | FA2 | FA3 | FB1 | FB2 | FB3 |
| NORMAL | 0 | 0 | 0 | 0 | 0 | 0 |
| ERROR SIGNAL EC IS GENERATED BY IPM3-2 | 0 | 1 | 0 | 1 | 0 | 0 |
| ERROR SIGNAL EC IS GENERATED BY IPM3-1 | 1 | 0 | 0 | 0 | 1 | 0 |
| CABLE CA1 IS DISCONNECTED | 0 | 0 | 0 | 0 | 0 | 1 |
| CABLE CA2 IS DISCONNECTED | 0 | 0 | 1 | 0 | 0 | 0 |

THIRD PREFERRED EMBODIMENT

FOURTH PREFERRED EMBODIMENT

POWER SEMICONDUCTOR APPARATUS PROVIDED WITH POWER CONTROLLING SEMICONDUCTOR MODULES CONNECTED IN PARALLEL TO EACH OTHER

BACKGROUND OF THE INVENTION

1. Field of the Invention

The present invention relates to an electric power semiconductor apparatus (referred to as a power semiconductor apparatus hereinafter) including a plurality of electric power controlling semiconductor modules (referred to as power controlling semiconductor modules hereinafter) connected in parallel to each other, and in particular, to a power semiconductor apparatus including a plurality of electric power controlling semiconductor modules such as intelligent power modules (referred to as IPMs hereinafter) connected in parallel to each other for controlling driving of power semiconductor devices such as metal oxide semiconductor field effect transistors (referred to as MOSFETs hereinafter) or insulated gate bipolar transistors (referred to as IGBTs hereinafter).

2. Description of the Related Art

Prior arts in relation to the power semiconductor apparatus including a plurality of electric power controlling semiconductor modules such as IPMs connected in parallel to each other for controlling driving of power semiconductor devices such as MOSFETs or IGBTs are disclosed in the following prior art documents.

(1) Japanese patent laid-open publication No. 2002-369497 (referred to as a first prior art document hereinafter).

(2) International patent laid-open publication No. WO01/089090 (referred to as a second prior art document hereinafter).

(3) Japanese patent laid-open publication No. 10-042548 (referred to as a third prior art document hereinafter).

(4) Japanese patent laid-open publication No. 10-014215 (referred to as a fourth prior art document hereinafter).

(5) Japanese patent laid-open publication No. 2002-369496 (referred to as a fifth prior art document hereinafter).

(6) Japanese patent laid-open publication No. 08-213890 (referred to as a sixth prior art document hereinafter).

(7) Japanese patent laid-open publication No. 2000-092820 (referred to as a seventh prior art document hereinafter).

The first prior art document discloses the following solving means for trying to prevent misdetection of overcurrent and heat concentration caused by switching over unbalance among power devices, when IPMs, each of which is made to be intelligent by providing a gate driving circuit in each of the power devices, operate under such a condition that they are connected in parallel to each other. FIG. 1 of the first prior art document shows the following invention. When two IPM circuits 2A and 2B, for example, operate in such a condition that they are connected in parallel to each other, output signals from delay circuits D1A and D2A that delay an operation command signal L1 are transmitted to the IPM circuit 2B, and output signals from delay circuits D1B and D2B are transmitted to the IPM circuit 2A so as to prevent switching over unbalance between power devices 3A and 3B of the respective IPM circuits 2A and 2B.

In addition, the second prior art document discloses the following solving means for loosening a criteria of selecting switching devices that constitute IPMs based on switching characteristics thereof, and for equally applying a current to the respective IPMs connected in parallel to each other. FIG. 1 of the second prior art document shows the following invention. First main electrodes, which are main current input-side electrodes of two switching devices, are connected to each other and second main electrodes, which are main current output-side electrodes of the two switching devices, are connected to each other. Such resistances that have a common resistance value are connected to the respective second main electrodes. A first wiring conductor connects the respective second main electrodes to each other via the resistances and auxiliary terminals thereof. A second wiring conductor connects control electrodes of the respective switching devices to each other via an impedance element having high impedance at a predetermined frequency.

Further, the third prior art document discloses the following solving means for preventing current distribution unbalance among semiconductor devices connected in parallel to each other and for realizing a semiconductor power converter apparatus having a desired capacity being small in size and inexpensive. FIG. 1 of the third prior art shows the following invention. In a semiconductor power converter apparatus including a plurality of power semiconductor devices connected in parallel to each other within one arm, anodes of IGBTQ1 and IGBTQ2 are connected to each other, control electrodes thereof are connected to each other, and cathodes thereof are connected to each other via inductance components L1 and L2, respectively. A gate driver circuit GDU is connected between a mutual connection point of the inductance components L1 and L2 and a mutual connection point of the control electrodes. Further, resistances are connected between each of the control electrodes and the GDU, respectively, and overvoltage protector circuits are connected between each of the control electrodes and each of the cathodes, respectively.

Still further, the fourth prior art document discloses the following solving means for performing a stable switching even if turn-on characteristics of switching devices operating in parallel are different from each other. FIG. 1 of the fourth prior art document shows the following invention. If one of switching devices 2 and 3 that are connected in parallel to each other is turned on faster than another, a current $\Delta iE$ flows in a circuit which connects emitter auxiliary terminals of the switching devices 2 and 3 to each other, due to an induced voltage generated by a floating inductance of a wiring on an emitter main circuit side of above-mentioned one of the switching devices 2 and 3. In addition, a voltage for dropping a gate voltage of the switching device is induced in a floating inductance of this circuit, however, the current $\Delta iE$ is reduced by an inductance of a transformer 12, and the voltage for dropping the gate voltage is suppressed. Then, such a phenomenon that the switching device is turned off while being turned on is prevented.

In addition, the fifth prior art document discloses the following solving means for trying to prevent misdetection of overcurrent and heat concentration caused by switching over unbalance among power devices, when IPMs, each of which is made to be intelligent by providing a gate driving circuit in each of the power devices, operate under such a condition that they are connected in parallel to each other. FIG. 1 of the fifth prior art document shows the following invention. When two IPM circuits 2A and 2B, for example, operate in such a condition that they are connected in parallel to each other, output signals from delay circuits D1A and D2A that delay an operation command signal L1 are transmitted to the IPM circuit 2B, and output signals from delay circuits D1B and D2B are transmitted to the IPM circuit 2A so as to prevent switching over unbalance between power devices 3A and 3B of the respective IPM circuits 2A and 2B.

Further, FIG. 1 of the sixth prior art document discloses the following solving means for trying to prevent misdetection of overcurrent and heat concentration caused by switching over unbalance among power devices, when IPMs, each of which is made to be intelligent by providing a gate driving circuit in each of power devices 3, operate under such a condition that they are connected in parallel to each other. FIG. 1 of the sixth prior art document shows the following invention. When the IPMs are used in such a state that they are connected in parallel to each other, the switching over unbalance between respective power devices 3 of circuits A and B is prevented by short-circuiting gates of the respective power devices 3 to each other through a short-circuit line 8.

Still further, the seventh prior art document discloses solving means for eliminating current unbalance among switching devices connected in parallel to each other with high accuracy. FIG. 12 of the seventh prior art document, the following steps are executed.

(1) Current sense voltages $V_{CS1}$ to $V_{CSn}$, which are detected values of main currents of "n" (where "n" is a positive integer of two or more.) IGBTs connected in parallel to each other are converted into digital voltages and then subjected to an arithmetic processing.

(2) The current sense voltages $V_{CS1}$ to $V_{CSn}$ are converted into collector currents $I_1$ to $I_n$ using constants $G_1$ to $G_n$ and offset voltages $V_{OFFSET1}$ to $V_{OFFSETn}$, respectively (in step 103), and then deviations $\Delta I_1$ to $\Delta I_n$ from an average $I_{AVG}$ of the collector currents $I_1$ to $I_n$ (in steps 104 and 105) are calculated.

(3) Driving control voltages $V_{D1}$ to $V_{Dn}$ are updated by as much as variations $\Delta V_{D1}$ to $\Delta V_{Dn}$ obtained by multiplying the deviations $\Delta I_1$ to $\Delta I_n$ by coefficients $K_{ij}$, respectively (in steps 106 and 107).

(4) The driving control voltages $V_{D1}$ to $V_{Dn}$ are converted into analog voltages, and the resultant analog voltages are supplied to the n IGBTs as gate voltages $V_{GE}$, respectively. The constants $G_1$ to $G_n$, the offset voltages $V_{OFFSET1}$ to $V_{OFFSETn}$, and the coefficients $K_{ij}$ are prepared for the "n" switching devices individually.

Above-mentioned prior arts mainly disclose concrete preventive means for preventing unbalance among currents that flow in respective IPMs or switching devices connected in parallel to each other, however, the prior arts have the following disadvantage. Generally speaking, protection circuits are connected to the respective IPMs or switching devices. A protection circuit provided in one of the IPMs or switching devices can operate so as to cut off an operation of this one of the IPMs or switching devices, on the other hand, another IPM or switching device continuously operates. By this operation, such a disadvantage that another IPM or switching device is destroyed or deteriorated, which results in decrease in lifetime thereof, arises.

SUMMARY OF THE INVENTION

An essential object of the present invention is therefore to solve the above-mentioned disadvantage and to provide a power semiconductor apparatus that includes a plurality of IPMs or switching devices connected in parallel to each other, when a protection circuit provided in one IPM or switching device operates to cut off an operation of this IPM or switching device, capable of cutting off an operation of another IPM or switching device.

In order to achieve the aforementioned objective, according to one aspect of the prevent invention, there is provided a power semiconductor apparatus provided with power controlling semiconductor modules connected in parallel to each other. The power semiconductor apparatus includes a plurality of power controlling semiconductor modules connected in parallel to each other, each power controlling semiconductor module controls driving of a power semiconductor device. The power semiconductor apparatus includes a transmission circuit provided in one power controlling semiconductor module and a reception circuit provided in another power controlling semiconductor module. The transmission circuit transmits a predetermined communication signal to another power controlling semiconductor module based on a predetermined activation signal generated by one power controlling semiconductor module. The reception circuit receives the transmitted communication signal, and controls driving control operation of another power controlling semiconductor module based on the received communication signal.

Therefore, according to the power semiconductor apparatus of the present invention, the activation signal is, for example, a protection alarm signal for protecting the power semiconductor device, the transmission circuit provided in one power controlling semiconductor module transmits the communication signal to another power controlling semiconductor module based on the protection alarm signal generated by the one power controlling semiconductor module. The reception circuit provided in another power controlling semiconductor module receives the transmitted communication signal and stops the driving control operation of another power controlling semiconductor module based on the received communication signal. Therefore, it is possible to stop the driving control operations of both of the power controlling semiconductor modules certainly. Accordingly, a safe operation can be realized in the power semiconductor apparatus.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 6 is a table showing a relationship between communication error signals FA1 and FA2 and that between communication error signals FB1 and FB2 relative to respective statuses of the power semiconductor apparatus shown in FIG. 1;

FIG. 8 is a table showing a relationship among communication error signals FA1, FA2, and FA3 and that among communication error signals FB1, FB2, and FB3 relative to respective statuses of the power semiconductor apparatus shown in FIG. 7;

DETAILED DESCRIPTION OF THE PREFERRED EMBODIMENTS

Figure 1:
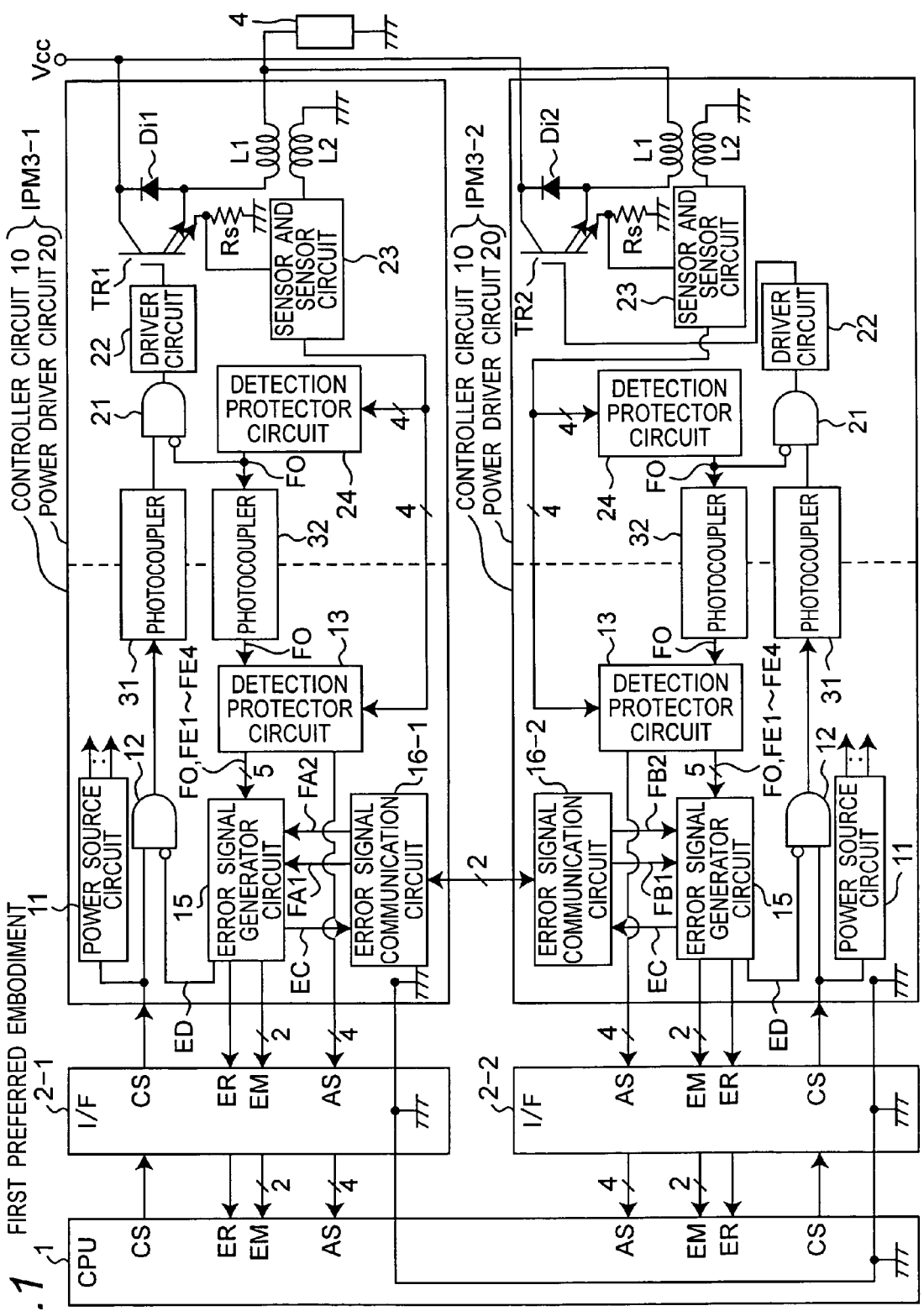
FIG. 1 is a block diagram showing a configuration of a power semiconductor apparatus according to a first preferred embodiment of the present invention.

Preferred embodiments according to the present invention will be described below with reference to the attached drawings. In the following preferred embodiments, components similar to each other are denoted by the same reference numerals.

First Preferred Embodiment

FIG. 1 is a block diagram showing a configuration of a power semiconductor apparatus according to a first preferred embodiment of the present invention. In the power semiconductor apparatus shown in FIG. 1, a central processing unit (referred to as a CPU hereinafter) 1 controls driving of IGBTTR1 and IGBTTR2 of the respective IPMs 3-1 and 3-2 by transmitting driving control signals CS to two IPMs 3-1 and 3-2 via interface circuits 2-1 and 2-2, respectively. A feedback diode Di1 is connected between a collector and a first emitter of the IGBTTR1 of the IPM 3-1, the collector of the IGBTTR1 is connected to a power source voltage Vcc, and the first emitter of the IGBTTR1 is connected to a first terminal of a loading device 4 via a current balancing inductance L1. In addition, a feedback diode Di2 is connected between a collector and a first emitter of the IGBTTR2 of the IPM 3-2, the collector of the IGBTTR2 is connected to the power source voltage Vcc, and the first emitter of the IGBTTR2 is connected to the first terminal of the loading device 4 via a current balancing inductance L1. Further, a second terminal of the loading device 4 is grounded. The IGBTTR1 and IGBTTR2 of the respective IPMs 3-1 and 3-2 are connected in parallel to each other by the above-mentioned connections.

Second emitters of the IGBTTR1 and IGBTTR2 of the respective IPMs 3-1 and 3-2 are grounded via current detection resistances Rs for detecting currents that flow in the IGBTTR1 and IGBTTR2, respectively. A non-grounded terminal of each of current detection resistances Rs is connected to a sensor and a sensor circuit 23. In addition, current detection inductances L2, which are provided so as to be electromagnetically loosely coupled to the current balancing inductances L1 of the respective IPMs 3-1 and 3-2, are provided to the respective inductances L1. One end of each of inductances L2 is connected to the sensor and sensor circuit 23 and another end thereof is grounded. In the present preferred embodiment, the current balancing inductances L1 and L1 (having such inductance values that are substantially the same as each other and sufficiently larger than, for example, a few μH) are included in the IPMs 3-1 and 3-2, respectively. In addition, one end of each of the current balancing inductances L1 and L1 are connected to the loading device 4. With these configurations, it is possible to make respective collector currents that flow in the respective IGBTTR1 and IGBTTR2 uniform using a well-known electric circuit technique.

Referring to FIG. 1, the interface circuit 2-1 performs an interface processing such as a predetermined signal conversion or electric insulation on the driving control signal CS from the CPU 1, and outputs the resultant signal CS to an AND gate 12 and a power source circuit 11 of the IPM 3-1. In addition, the interface circuit 2-1 receives an error signal ER, two error mode signals EM, and four analog detection signals AS (that will be described later in detail) from the IPM 3-1, performs the interface processing such as a predetermined signal conversion or electric insulation on these signals ER, EM, and AS, and outputs the resultant signals to the CPU 1. The interface circuit 2-2 performs an interface processing such as a predetermined signal conversion or electric insulation on the driving control signal CS from the CPU 1, and outputs the resultant signal CS to an AND gate 12 and a power source circuit 11 of the IPM 3-2. In addition, the interface circuit 2-2 receives an error signal ER, two error mode signals EM, and four analog detection signals AS from the IPM 3-2, performs an interface processing such as a predetermined signal conversion or electric insulation on these signals ER, EM, and AS, and outputs the resultant signals to the CPU 1.

Further, as shown in FIG. 1, a grounding terminal of the IPM 3-1 is connected to a grounding terminal of the CPU 1 via a grounding terminal of the interface circuit 2-1. A grounding terminal of the IPM 3-2 is connected to the grounding terminal of the CPU 1 via a grounding terminal of the interface circuit 2-2. Namely, the grounding terminals of the IPMs 3-1 and 3-2 are not directly connected to each other. With these connections, a loop circuit having grounding potential is not formed. Accordingly, it is prevented that circuits such as the IPMs 3-1 and 3-2 detect noises.

Next, configurations and operations of the IPMs 3-1 and 3-2 (generically denoted by reference numeral 3, and the interface circuits 2-1 and 2-2 will be generically denoted by reference numeral 2, hereafter) will be described. These two IPMs 3-1 and 3-2 have such configurations that are similar to each other. Accordingly, the same reference numerals are given to circuits of respective structural elements of the respective IPMs 3-1 and 3-2 except for error signal communication circuits 16-1 and 16-2, the IGBTTR1 and IGBTTR2, and the feedback diodes Di1 and Di2 which need to be described in distinction from each other, and a configuration and an operation of one IPM 3 will be mainly described. Referring to FIG. 1, each of the IPM 3 consists of a controller circuit 10 and a power driver circuit 20 that are shown in left and right portions of the IPM 3, respectively. The circuits 10 and 20 are connected to each other via photocouplers 31 and 32 so as to be electrically isolated from each other.

The power source circuit 11 extracts electric energy from the driving control signal CS transmitted from the interface circuit 2, and supplies a power source voltage to respective circuits provided within the IPM 3. In addition, the driving control signal CS transmitted from the interface circuit 2 is outputted to a driver circuit 22 via the AND gate 12, the photocoupler 31, and an AND gate 21. The driver circuit 22 drives the IGBTTR1 or IGBTTR2 so as to be turned on in response to the driving control signal CS having a the high level. An error signal ED from an error signal generator circuit 15 is inputted to an inverted input terminal of the AND gate 12. The AND gate 12 cuts off the driving control signal CS when it receives the error signal ED having the high level. In addition, a protection alarm signal FO (Fault Out) from a detection protector circuit 24 is inputted to an inverted input terminal of the AND gate 21. The AND gate 21 cuts off the driving control signal CS when the AND gate 21 receives the protection alarm signal FO having the high level.

In the power driver circuit 20 of the IPM 3, the sensor and sensor circuit 23 preferably includes the following sensors connected to the sensor and sensor circuit 23 and the following sensors included within the circuit 23, and outputs detection signals to detection protector circuits 13 and 24, respectively, as follows, and each of the detection protector circuits 13 and 24 compares the detection signal with a predetermined threshold value, and generates a protection alarm signal as follows.

(1) Current detection inductor L2: the current detection inductor L2 detects a current value of a collector current of the IGBTTR1 or IGBTTR2 and outputs the detected current value to the sensor and sensor circuit 23. In response to this, the sensor and sensor circuit 23 outputs a detection signal indicating the detected current value to the detection protector circuit 13. In order to prevent thermal destruction of the IGBTTR1 or IGBTTR2 due to overcurrent, the detection protector circuit 13 compares the detected current value with a predetermined overcurrent protection (OC) trip level, and generates an OC protection alarm signal FE1 when the detected current is equal to or larger than the trip level. In addition, to prevent the destruction of the IGBTTR1 or IGBTTR2 due to short-circuit current, the detection protector circuit 13 compares the detected current value with a predetermined short-circuit protection (SC) trip level (whose level is larger than that of the overcurrent (OC) trip level), and generates an SC protection alarm signal FE2 when the detected current is equal to or larger the trip level.

(2) Current detection resistance Rs: the current detection resistance Rs detects the current value of the collector current of the IGBTTR1 or IGBTTR2 from an emitter current that flows in a second emitter thereof, and outputs the detected current value to the sensor and sensor circuit 23. In response to this, the sensor and sensor circuit 23 outputs a detection signal indicating the detected value to the detection protector circuit 24. In order to prevent thermal destruction of the IGBTTR1 or IGBTTR2 due to overcurrent, the detection protector circuit 24 compares the detected current value with the predetermined overcurrent protection (OC) trip level, and generates an OC protection alarm signal FE1 when the detected current is equal to or larger than the trip level. In addition, to prevent the destruction of the IGBTTR1 or IGBTTR2 due to the short-circuit current, the detection protector circuit 24 compares the detected current value with the predetermined short-circuit protection (SC) trip level, and generates an SC protection alarm signal FE2 when the detected current is equal to or larger the trip level.

(3) Temperature detection thermistor: a temperature detection thermistor (not shown), which is provided on an insulation power substrate onto which an IGBT chip is bonded, detects a temperature of the IGBTTR1 or IGBTTR2 and outputs a detected temperature value to the sensor and sensor circuit 23. In response to this, the sensor and sensor circuit 23 outputs a detection signal indicating the detected temperature value to the detection protector circuits 13 and 24. In order to prevent thermal destruction of the IGBTTR1 or IGBTTR2 due to overheat, each of the detection protector circuits 13 and 24 compares the detected temperature value with a predetermined overheat protection (OT) trip level, and generates an OT protection alarm signal FE3 when the detected temperature value is equal to or larger than the trip level.

(4) Control power source voltage detection sensor: a control power source voltage detection sensor (not shown) detects a control power source voltage of the IPM by an internal circuit of the IPM 3, and outputs a detected voltage value to the sensor and sensor circuit 23. In response to this, the sensor and sensor circuit 23 outputs a detection signal indicating the detected voltage value to the detection protector circuits 13 and 24. In order to prevent device destruction due to reduction in the control power source voltage, each of the detection protector circuits 13 and 24 compares the detected voltage value with a predetermined control power source voltage drop protector circuit (UV) trip level, and generates an UV protection alarm signal FE4 when the detected control power source voltage value of the IPM is equal to or lower than the trip level.

The detection protector circuit 24 calculates a logical sum of the generated four protection alarm signals FE1 to FE4, generates the protection alarm signal FO indicating the calculated logical sum value, and outputs the protection alarm signal FO to the inverted input terminal of the AND gate 21 and the detection protector circuit 13 via the photocoupler 32. The detection protector circuit 13 generates the four analog detection signals, which indicate the inputted four detected values, respectively, and outputs them to the CPU 1 via the interface circuit 2. With these outputs, the CPU 1 can check the four detected values based on the four analog detection signals AS. Further, the detection protector circuit 13 outputs the generated four protection alarm signals FE1 to FE4 and the protection alarm signal FO from the detection protector circuit 24 to the error signal generator circuit 15.

Figure 2:
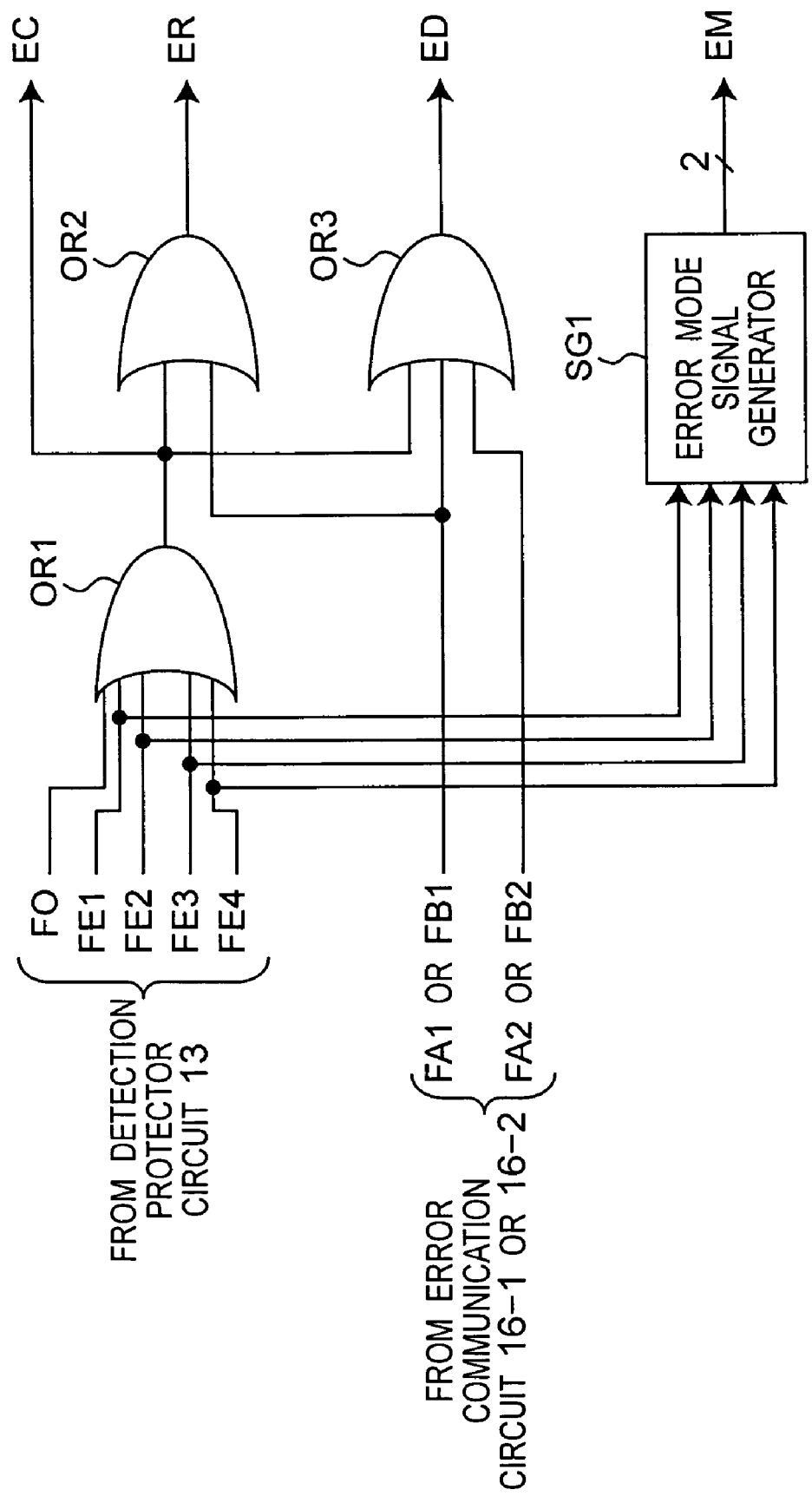
FIG. 2 is a block diagram showing a detailed configuration of an error signal generator circuit 15 shown in FIG. 1.

FIG. 2 is a block diagram showing a detailed configuration of the error signal generator circuit 15 shown in FIG. 1. The error signal generator circuit 15 is constructed by including three OR gates OR1, OR2, and OR3, and an error mode signal generator SG1. The five protection alarm signals FO and FE1 to FE4 from the detection protector circuit 13 are inputted to the OR gate OR1. The OR gate OR1 calculate a logical sum of the inputted five protection alarm signals FO and FE1 to FE4, generates an error signal EC indicating the calculated logical sum value, and outputs the error signal EC to the error signal communication circuit 16-1 or 16-2 and the OR gates OR2 and OR3. A communication error signal FA1 or FB1 from the error signal communication circuits 16-1 or 16-2 is inputted to the OR gates OR2 and OR3. In addition, a communication error signal FA2 or FB2 from the error signal communication circuits 16-1 or 16-2 is inputted to the OR gate OR3. Further, the OR gate OR2 calculates a logical sum of the inputted two signals (the error signal EC and the communication error signal FA1 or the error signal EC and the communication error signal FA2), generates an error signal ER indicating the calculated logical sum value, and outputs the error signal ER to the CPU 1 via the interface circuit 2. The OR gate OR3 calculates a logical sum of the inputted three error signals EC, FA1 or FB1, and FA2 or FB2, generates an error signal ED indicating the calculated logical sum value, and outputs the error signal ED to the inverted input terminal of the AND gate 12.

Figures 4, 5:
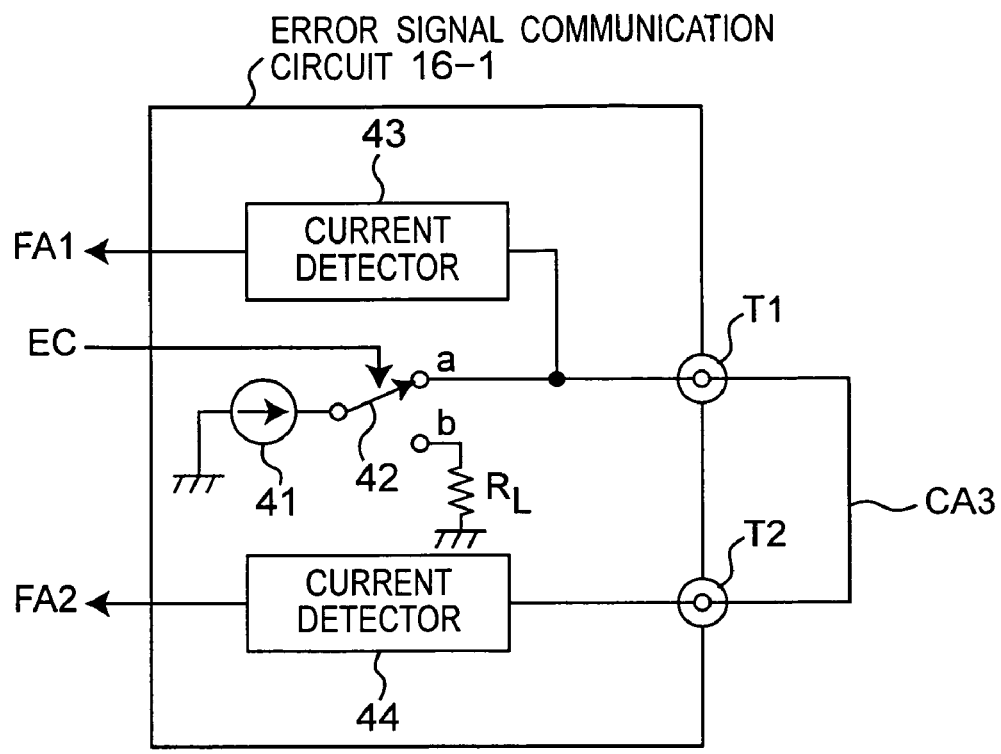
FIG. 4 is a block diagram showing a connection when the error signal communication circuit 16-1 shown in FIG. 1 operates solely.
FIG. 5 is a table showing relationships between protection error signals FE1 to FE4 and an error mode signal EM in the power semiconductor apparatus shown in FIG. 1.

In addition, referring to FIG. 2, the four protection alarm signals FE1 to FE4 from the detection protector circuit 13 are inputted to the error mode signal generator SG1. The error mode signal generator SG1, as shown in FIG. 5, generates a two-bit error mode signal EM (em1 and em2) corresponding to the protection alarm signals FE1 to FE4, and outputs the signal EM to the CPU 1 via the interface circuit 2. An "oscillation signal" shown in FIG. 5 is preferably a rectangular pulse signal, which oscillates at a predetermined frequency. The CPU 1 can check which protection alarm is generated based on the inputted two-bit error mode signal EM (em1 and em2).

In the present preferred embodiment, each of the error signals and the protection alarm signals has a the low level or zero in a normal state in which no error is detected, and it has the high level or one in an error state in which a protection is necessary.

Figure 3:
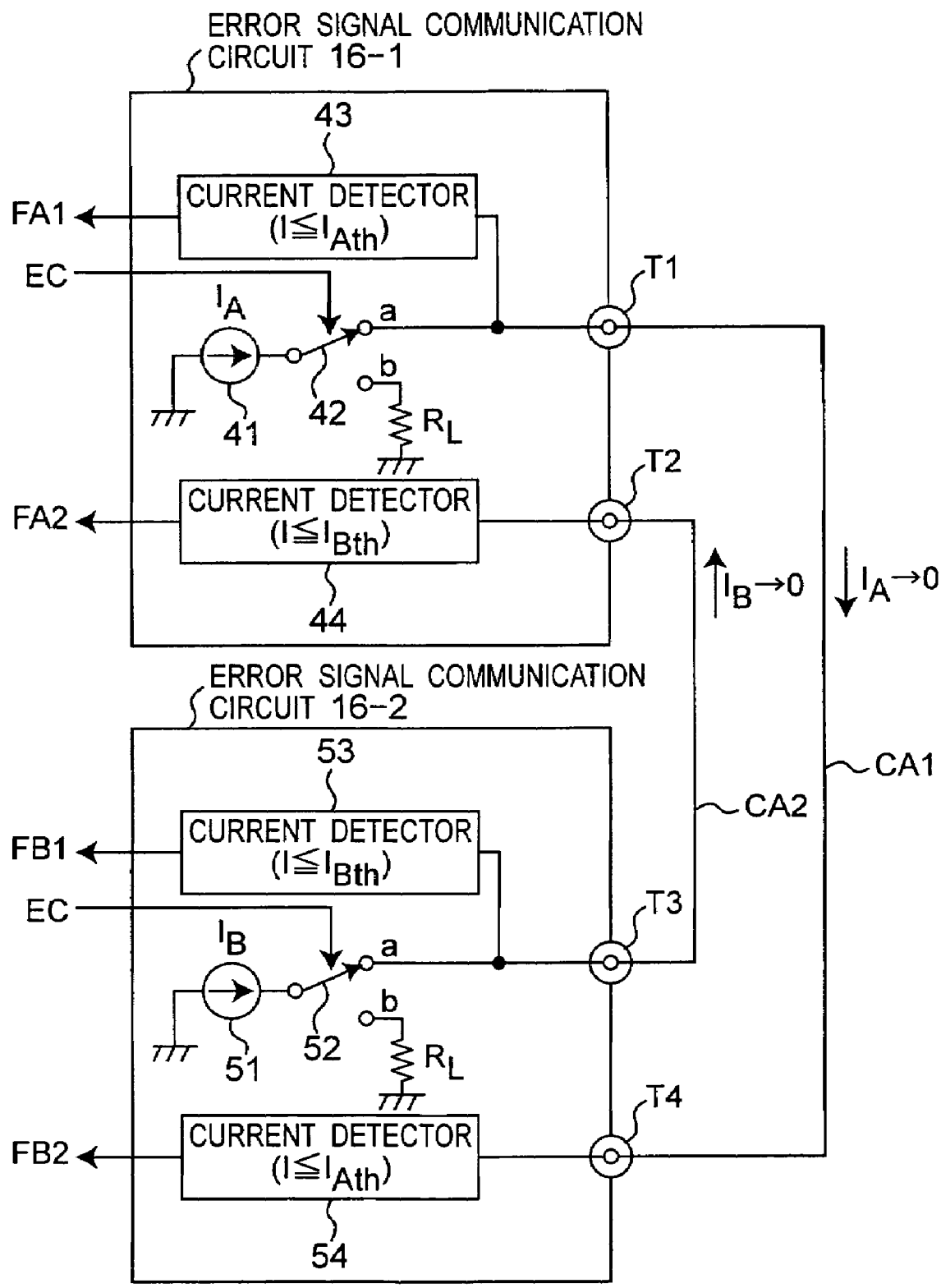
FIG. 3 is a block diagram showing detailed configurations of error signal communication circuits 16-1 and 16-2 shown in FIG. 1, and a connection between the error signal communication circuits 16-1 and 16-2.

FIG. 3 is a block diagram showing detailed configurations of the error signal communication circuits 16-1 and 16-2 and, a connection between the error signal communication circuits 16-1 and 16-2. Referring to FIG. 3, configurations and operations of the error signal communication circuits 16-1 and 16-2 will be described.

Referring to FIG. 3, the error signal communication circuit 16-1 is constructed by including a current source 41, a switch 42, a load resistance $R_L$, and two current detectors 43 and 44. In addition, the error signal communication circuit 16-2 is constructed by including a current source 51, a switch 52, a load resistance $R_L$, and two current detectors 53 and 54. The current source 41 outputs a DC current of a predetermined current value $I_A$ to the current detector 43 via a contact "a" of the switch 42, and the current detector 54 of the error signal communication circuit 16-2 via a terminal T1, a cable CA1, and a terminal T4 of the error signal communication circuit 16-2. In addition, the current source 51 outputs a DC current of a predetermined current value $I_B$ to the current detector 53 via a contact "a" of the switch 52, and the current detector 44 of the error signal communication circuit 16-1 via a terminal T3, a cable CA2, and a terminal T2 of the error signal communication circuit 16-1.

In the IPM 3-1, if the error signal EC from the error signal generator circuit 15 has the low level, the switch 42 is switched over to the contact "a" thereof. If the error signal EC has the high level, the switch 42 is switched over to a contact "b" thereof so that the switch 42 cuts off the DC current of the current value $I_A$. The current detector 43 detects an inputted DC current value "I", and compares the DC current value "I" with a threshold current value $I_{Ath}$, which is slightly smaller than the current value $I_A$ (note that the reason for setting the threshold current value $I_{Ath}$ to be slightly smaller than the current value $I_A$ in the present preferred embodiment is to set a deviation margin, and that the same thing is true for the following preferred embodiments). When the DC current value "I" becomes equal to or smaller than the threshold current value $I_{Ath}$ while the DC current is cut off by the switch 42, the current detector 43 outputs the communication error signal FA1 to the error signal generator circuit 15. In addition, the current detector 54 detects the DC current value "I" inputted via the terminal T4 and compares the DC current value "I" with the threshold current value $I_{Ath}$. When the detected DC current value "I" becomes equal to or smaller than the threshold current value $I_{Ath}$ while the DC current is cut off by the switch 42 or the cable CA1 is disconnected or not connected, the current detector 54 outputs the communication error signal FB2 to the error signal generator circuit 15.

In the circuits thus constructed, as apparent from the error signal generator circuit 15 shown in FIG. 2, the error signals ER and ED having the high levels are generated based on the communication error signal FA1 so as to stop a driving control on the IGBTTR1 provided within the IPM 3-1. On the other hand, the error signal ED having the high level is generated by the IPM 3-2 based on the communication error signal FB2 so as to stop a driving control on the IGBTTR2 provided within the IPM 3-2. That is, the error signals can be shared between the IPMs 3-1 and 3-2, and when one IMP 3 stops operating based on the error signal, another IPM 3 can stop operating based on the error signal.

In the IPM 3-2, if the error signal EC from the error signal generator circuit 15 has the low level, the switch 52 is switched over to the contact "a" thereof. If the error signal EC has the high level, the switch 52 is switched over to a contact "b" thereof so that the switch 52 cuts off the DC current of the current value $I_B$. The current detector 53 detects an inputted DC current value "I", and compares the DC current value "I" with a threshold current value $I_{Bth}$, which is slightly smaller than the current value $I_B$. When the DC current value "I" becomes equal to or smaller than the threshold current value $I_{Bth}$ while the DC current is cut off by the switch 52, the current detector 53 outputs the communication error signal FB1 to the error signal generator circuit 15. In addition, the current detector 44 detects the DC current value "I" inputted via the terminal T2 and compares the DC current value "I" with the threshold current value $I_{Bth}$. When the detected DC current value "I" becomes equal to or smaller than the threshold current value $I_{Bth}$ while the DC current is cut off by the switch 52 or the cable CA2 is disconnected or not connected, the current detector 44 outputs the communication error signal FA2 to the error signal generator circuit 15.

In the circuits thus constructed, as apparent from the error signal generator circuit 15 shown in FIG. 2, the error signals ER and ED are generated based on the communication error signal FB1 so as to stop a driving control on the IGBTTR2 provided within the IPM 3-2. On the other hand, the error signal ED is generated by the IPM 3-1 based on the communication error signal FB1 so as to stop a driving control on the IGBTTR1 provided within the IPM 3-1. That is, the error signals can be shared between the IPMs 3-1 and 3-2, and when one IMP 3 stops operating based on the error signal, another IPM 3 can stop operating based on the error signal.

In the circuits shown in FIG. 3, by transmitting or receiving the constant current, generation of the error signal EC or disconnections of the cables CA1 and CA2 are detected. Accordingly, this detection is not influenced by fluctuations in grounding levels of the respective IPMs 3-1 and 3-2. If the error signal is generated by the IPM 3-1, then the driving control signal CS is cut off by the detection protector circuits 13 and 24 of the IPM 3-1 itself, and the IPM 3-1 stops operating. Therefore, it is not necessary to output the communication error signal FA1 from the current detector 43 to anywhere. In addition, if the error signal is generated by the IPM 3-2, then the driving control signal CS is cut off by the detection protector circuits 13 and 24 of the IPM 3-2 itself, and the IPM 3-2 stops operating. Therefore, it is not necessary to output the communication error signal FB1 from the current detector 53 to anywhere.

In addition, in the circuits shown in FIG. 3, the error signal is transmitted or transmission of the error signal is stopped in response to turning on or off of the constant current, however, the present invention is not limited to this. The error signal may be transmitted or the transmission of the error signal may be stopped in response to increasing or decreasing in the current value of the constant current.

Further, if a failure such as a disconnection or non-connection occurs to the cable CA1 or CA2, the DC current does not flow in the cable CA1 or CA2, and therefore, based on the communication error signal FB2 from the current detector 54 or the communication error signal FA2 from the current detector 44, a failure status of the cable CA1 or CA2 can be detected. Namely, as shown in FIG. 6, a relationship between the communication error signals FA1 and FA2 and that between the communication error signals FB1 and FB2 are changed in response to respective statuses of the power semiconductor apparatus shown in FIG. 1, respectively. The respective statuses includes such statuses in which the error signal EC is generated either in the IPM 3-1 or in the IPM 3-2, an in which either the cable CA1 or the cable CA2 is disconnected. Therefore, it is possible to check the respective statuses. Referring to FIG. 6, such a status in which the generation of the error signal EC and the disconnection of the cable CA1 or CA2 occur simultaneously is not considered.

FIG. 4 is a block diagram showing a connection when the error signal communication circuit 16-1 shown in FIG. 1 operates solely. Referring to FIG. 4, between the terminals T1 and T2 of the error signal communication circuit 16-1 provided within the IPM 3-1 are short-circuited by a short-circuit cable C3. As shown in FIG. 4, an internal configuration of the error signal communication circuit 16-1 remains the same. In addition, since a current flows in the short-circuit cable C3, the error signal communication circuit 16-1 can operate even solely without the error signal communication circuit 16-2. Further, if the short-circuit cable CA3 is not connected to the error signal communication circuit 16-1, the circuit 16-1 does not operate. Therefore, it is possible to prevent such a failure that the cable CA3 is not connected to the circuit 16-1.

As described so far, according to the first preferred embodiment, the communication error signals FA1, FA2, FB1 and FB2 are generated and communication is held between the IPMs 3-1 and 3-2 using the error signal communication circuits 16-1 and 16-2. Due to this, if the error signal EC is generated by one IPM, the communication error signal FB2 or FB1 is generated, and then the error signal ED is generated by another IPM. Therefore, it is possible to stop the operations of both of the IGBTTR1 and IGBTTR2 certainly. Accordingly, a safe operation can be realized in the power semiconductor apparatus.

In the present preferred embodiment as described as so far, the error signal is transmitted and received using the wired cables CA1 and CA2, however, the present invention is not limited to this. The error signal may be transmitted and received via a predetermined network line or a radio communication line.

In the present preferred embodiment as described so far, the communication error signal is transmitted and received between the IPMs 3-1 and 3-2 by means of a two-way communication, however, the present invention is not limited to this. The communication error signal may be transmitted from the IPM 3 in which the error signal or protection alarm signal is generated to another IPM 3 by means of a one-way communication.

In the present preferred embodiment as described so far, one IPM 3 transmits the communication error signal to another IPM 3 based on the protection alarm signal generated by the one IPM 3 for protecting the IGBTTR1 that is a power semiconductor device. Another IPM 3 receives the transmitted communication error signal and stops the driving control operation of the one IPM 3 based on the received communication error signal, however, the present invention is not limited to this. The power semiconductor apparatus may be constructed so that one IPM 3 transmits a predetermined communication signal to another IPM 3 based on a predetermined activation signal generated by the one IPM 3, and another IPM 3 receives the transmitted communication signal and controls the driving control operation of another IPM 3 based on the received communication signal.

Second Preferred Embodiment

Figure 7:
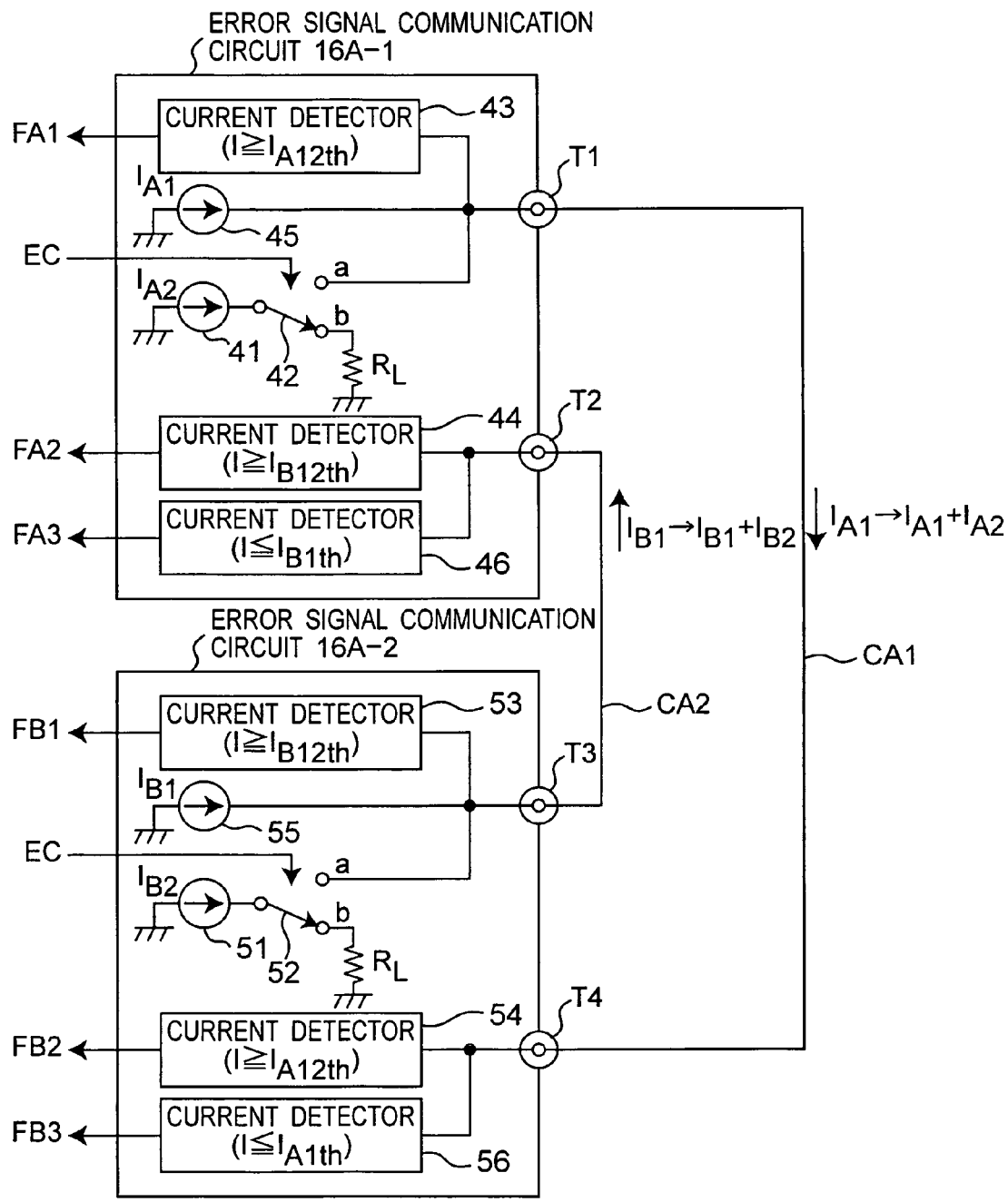
FIG. 7 is a block diagram showing detailed configurations of error signal communication circuits 16A-1 and 16A-2 of a power semiconductor apparatus according to a second preferred embodiment of the present invention and a connection between the error signal communication circuits 16A-1 and 16A-2.

FIG. 7 is a block diagram showing detailed configurations of error signal communication circuits 16A-1 and 16A-2 of a power semiconductor apparatus according to a second preferred embodiment of the present invention and a connection between the error signal communication circuits 16A-1 and 16A-2. In the first preferred embodiment, since the IPMs 3-1 and 3-2 use the two communication error signals FA1 and FA2 and the two communication error signals FB1 and FB2, respectively, the following disadvantages arise as shown in FIG. 6.

(1) The signal values in such a status that the error signal EC is generated by the IPM 3-2 and in such a status that the cable CA2 is disconnected are the same as each other. In this case, it is impossible to distinguish the one status from another status.

(2) The signal values in such a status that the error signal EC is generated by the IPM 3-1 and in such a status that the cable CA1 is disconnected are the same as each other. In this case, it is impossible to distinguish the one status from another status.

In order to solve these disadvantages, the error signal communication circuits 16A-1 and 16A-2 of the power semiconductor apparatus according to the second preferred embodiment are different from the error signal communication circuits 16-1 and 16-2 according to the first preferred embodiment shown in FIG. 3 in the following points.

(1) The error signal communication circuit 16A-1 further includes a current source 45 and a current detector 46.

(2) The error signal communication circuit 16A-2 further includes a current source 55 and a current detector 56.

(3) In response to an error signal EC having the high level, each of switches 42 and 52 is switched over from a contact "b" thereof to a contact "a" thereof.

(4) Current values of current sources 41, 45, 51, and 55 are set to be $I_{A1}$, $I_{A2}$, $I_{B1}$, and $I_{B2}$, respectively, and threshold values for current detection or current non-detection of current detectors 43, 44, 46, 53, 54, and 56 are changed to $I_{A12th}$, $I_{B12th}$, $I_{B1th}$, $I_{B12th}$, $I_{A12th}$, and $I_{A1th}$, respectively. The threshold value $I_{A1th}$ is set to be slightly smaller than a current value $I_{A1}$ so as to detect the current value $I_{A1}$. The threshold value $I_{A12th}$ is set to be slightly smaller than a sum of current values $(I_{A1}+I_{A2})$ so as to detect the sum of current values $(I_{A1}+I_{A2})$. The threshold value $I_{B1th}$ is set to be slightly smaller than a current value $I_{B1}$ so as to detect the current value $I_{B1}$. In addition, the threshold value $I_{B12th}$ is set to be slightly smaller than a sum of current values $(I_{B1}+I_{B2})$ so as to detect the sum of current values $(I_{B1}+I_{B2})$.

In the error signal communication circuit 16A-1 of the IPM 3-1, the current source 45 outputs a DC current of the current value $I_{A1}$ to the current detector 43 and the current detectors 54 and 56 of the error signal communication circuit 16A-2 via a terminal T1, a cable CA1, and a terminal T4. In addition, when the error signal EC from an error signal generator circuit 15 has the low level, the switch 42 is switched over to the contact "b" thereof. If the error signal EC has the high level, the switch 42 is switched over to the contact "a" thereof. In addition, the current source 41 outputs a DC current of the current value $I_{A2}$ to the current detector 43 and the current detectors 54 and 56 of the error signal communication circuit 16A-2 via the terminal T1, the cable CA1, and the terminal T4. The current detector 43 outputs a communication error signal FA1 when the current value of the inputted DC current becomes equal to or larger than the threshold $I_{A12th}$. The current detector 54 of the error signal communication circuit 16A-2 outputs a communication error signal FB2 when the current value of the inputted DC current becomes equal to or larger than the threshold value $I_{A12th}$. Further, the current detector 56 outputs a communication error signal FB3 when the current value of the DC current inputted to the terminal T4 becomes equal to or smaller than the threshold value $I_{A1th}$. Namely, when the cable CA1 is disconnected, for example, the current value of the DC current inputted to the terminal T4 is zero. The current detector 56, therefore, outputs the communication error signal FB3.

In the above-stated case, the communication error signals FA1 and FB2 have the high levels only when the cable CA1 is not disconnected and the error signal EC is generated by the IP 3-1. When the cable CA1 is disconnected, only the communication error signal FB3 has the high level. Accordingly, it is possible to distinguish the status in which the cable CA1 is disconnected from the status in which the error signal EC is generated by the IPM 3-1 base on the communication error signals and the disadvantages of the circuit shown in FIG. 3 can be solved.

In addition, in the error signal communication circuit 16A-2 of the IPM 3-2, the current source 55 outputs a DC current of the current value $I_{B1}$ to the current detector 53 and the current detectors 44 and 46 of the error signal communication circuit 16A-1 via a terminal T3, a cable CA2, and a terminal T2. In addition, when the error signal EC from an error signal generator circuit 15 has the low level, the switch 52 is switched over to the contact "b" thereof. If the error signal EC has the high level, the switch 52 is switched over to the contact "a" thereof. In addition, the current source 51 outputs a DC current of the current value $I_{B2}$ to the current detector 53 and the current detectors 44 and 46 of the error signal communication circuit 16A-1 via the terminal T3, the cable CA2, and the terminal T2. The current detector 53 outputs a communication error signal FB1 when the current value of the inputted DC current becomes equal to or larger than the threshold $I_{B12th}$. The current detector 44 of the error signal communication circuit 16A-1 outputs a communication error signal FA2 when the current value of the inputted DC current becomes equal to or larger than the threshold value $I_{B12th}$. Further, the current detector 46 outputs a communication error signal FA3 when the current value of the DC current inputted to the terminal T2 becomes equal to or smaller than the threshold value $I_{B1th}$. Namely, when the cable CA2 is disconnected, for example, the current value of the DC current inputted to the terminal T2 is zero. The current detector 46, therefore, outputs the communication error signal FA3.

In the above-stated case, the communication error signals FB1 and FA2 have the high levels only when the cable CA2 is not disconnected and the error signal EC is generated by the IP 3-2. When the cable CA2 is disconnected, only the communication error signal FA3 has the high level. Accordingly, it is possible to distinguish the status in which the cable CA2 is disconnected from the status in which the error signal EC is generated by the IPM 3-2 by the communication error signals and the disadvantages of the circuit shown in FIG. 3 can be solved.

FIG. 8 is a table showing a relationship among the communication error signals FA1, FA2, and FA3 and that among the communication error signals FB1, FB2, and FB3 relative to respective statuses of the power semiconductor apparatus shown in FIG. 7. Referring to FIG. 8, such a status in which the generation of the error signal EC and the disconnection of the cable CA1 or CA2 occur simultaneously is not considered. As evident from FIG. 8, the respective statuses can be distinguished from each other and checked based on the six communication error signals.

As described so far, according to the present preferred embodiment, in a manner similar to that of the first preferred embodiment, the operation of one IPM 3 can be stopped based on the generation of the error signal in another IPM 3. In addition, the generation of the error signals in the respective IPMs 3 and the disconnection of the respective cables CA1 and CA2 can be confirmed so as to be distinguished from each other based on the six communication error signals.

In the present preferred embodiment, in the error signal communication circuit 16A-1, for example, the current value of the current that flows in the terminal T1 is increased from $I_{A1}$ to ($I_{A1}+I_{A2}$) based on the error signal EC, however, the present invention is not limited to this. The error signal may be transmitted by reducing the current value of the current that flows in the terminal T1 from $I_{A1}$ to ($I_{A1}-I_{A2}$). In addition, the same thing is true for the error signal communication circuit 16-2.

Third Preferred Embodiment

Figure 9:
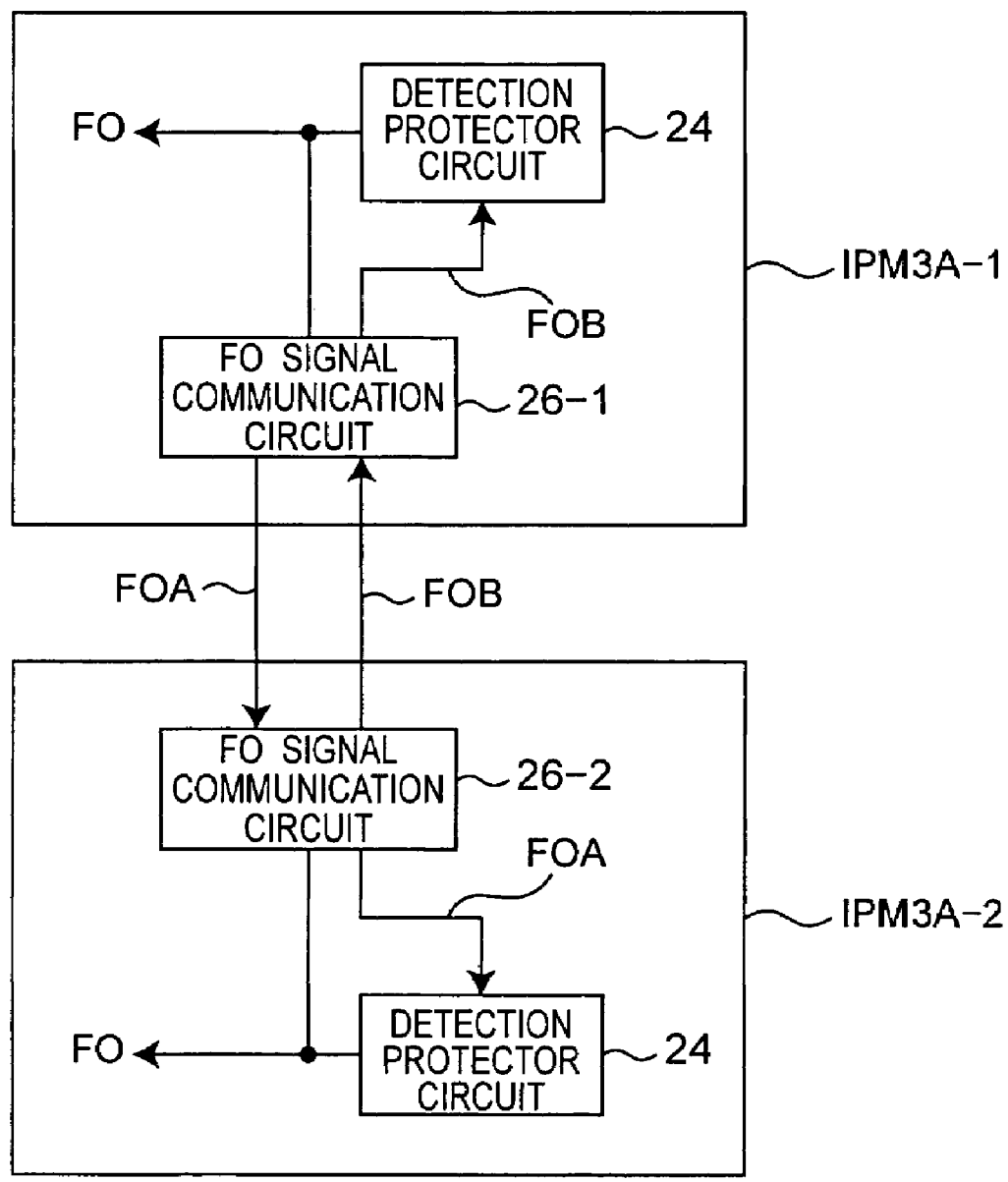
FIG. 9 is a block diagram showing detailed configurations of an IPM3A-1 and an IPM3A-2 of a power semiconductor apparatus according to a third preferred embodiment of the present invention and a connection between the IPM3A-1 and IPM3A-2.

FIG. 9 is a block diagram showing detailed configurations of an IPM3A-1 and an IPM3A-2 of a power semiconductor apparatus according to a third preferred embodiment of the present invention and a connection between the IPM3A-1 and IPM3A-2. As shown in FIG. 9, the present preferred embodiment is characterized, as compared with the first preferred embodiment, in that the IPMs 3A-1 and 3A-2 further include FO signal communication circuits 26-1 and 26-2, respectively.

Referring to FIG. 9, a protection alarm signal FO from a detection protector circuit 24 of the IPM 3A-1 is inputted to the FO signal communication circuit 26-1, and the FO signal communication circuit 26-1 outputs the protection alarm signal FO, as a protection alarm signal FOA, to a detection protector circuit 24 of the IPM 3A-2 via the FO signal communication circuit 26-2 of the IPM 3A-2. The detection protector circuit 24 of the IPM 3A-2 calculates a logical sum of the received protection alarm signal FOA and other protection alarm signals FE1 to FE4, and outputs the calculated logical sum value, as a protection alarm signal FO, to an AND gate 21 and a detection protector circuit 13 within the IPM 3A-2 and the FO signal communication circuit 26-2.

In addition, the protection alarm signal FO from the detection protector circuit 24 of the IPM 3A-2 is inputted to the FO signal communication circuit 26-2, and the FO signal communication circuit 26-2 outputs the protection alarm signal FO, as a protection alarm signal FOB, to a detection protector circuit 24 of the IPM 3A-1 via the FO signal communication circuit 26-1 of the IPM 3A-1. The detection protector circuit 24 of the IPM 3A-1 calculates a logical sum of the received protection alarm signal FOB and the other protection alarm signals FE1 to FE4, and outputs the calculated logical sum value, as the protection alarm signal FO, to an AND gate 21 and a detection protector circuit 13 provided within the IPM 3A-1 and the FO signal communication circuit 26-1.

As described so far, according to the third preferred embodiment, the communication error signal is transmitted and received between controller circuits 10 of the respective IPMs 3A-1 and 3A-2 in a manner similar to that of the first preferred embodiment, and the protection alarm signal FO is transmitted and received between power driver circuits 20 of the respective IPMs 3A-1 and 3A-2. Accordingly, it is possible to stop the operations of both the IPMs 3A-1 and 3A-2 more certainly.

Fourth Preferred Embodiment

Figure 10:
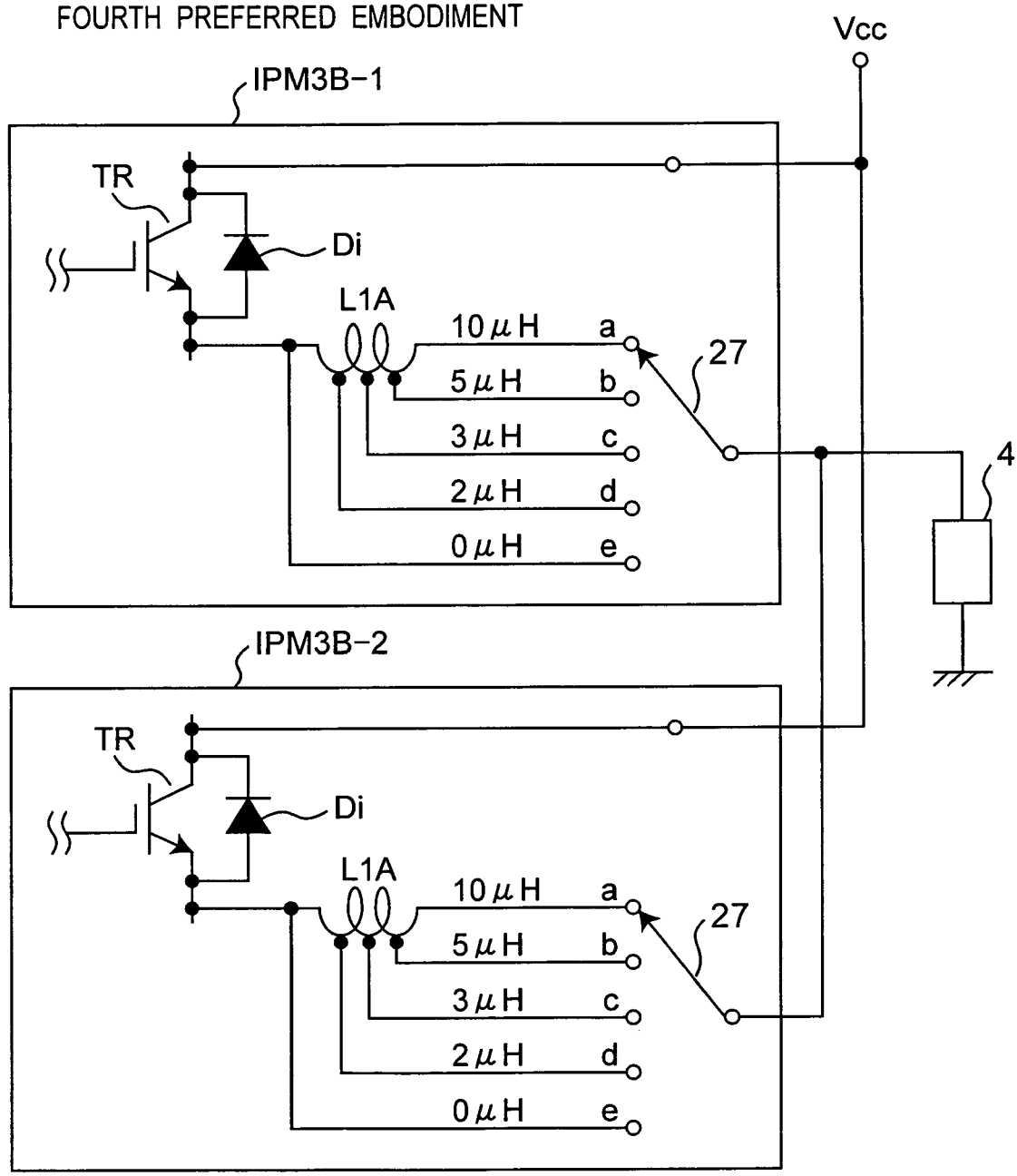
FIG. 10 is a block diagram showing a detailed configuration of an output circuit that includes current balancing inductors L1A and switches 27 in a power semiconductor apparatus according to a fourth preferred embodiment of the present invention.

FIG. 10 is a block diagram showing a detailed configuration of an output circuit that includes current balancing inductors L1A and switches 27 in a power semiconductor apparatus according to a fourth preferred embodiment of the present invention. As shown in FIG. 10, the power semiconductor apparatus according to the present preferred embodiment has such a configuration that the respective current balancing inductors L1 according to the first preferred embodiment are replaced by the current balancing inductors L1A each having an intermediate tap and the switches 27 in IPMs 3B-1 and 3B-2. Referring to FIG. 10, an inductance value of each of the inductors L1A can be changed when the switch 27 is switched over to each contact thereof as follows.

(1) When the switch 27 is switched over to a contact "a" thereof, the inductance value of the inductor L1A can be set to, for example, 10 μH.

(2) When the switch 27 is switched over to a contact "b" thereof, the inductance value of the inductor L1A can be set to, for example, 5 μH.

(3) When the switch 27 is switched over to a contact "c" thereof, the inductance value of the inductor L1A can be set to, for example, 3 μH.

(4) When the switch 27 is switched over to a contact "d" thereof, the inductance value of the inductor L1A can be set to, for example, 2 μH.

(5) When the switch 27 is switched over to a contact "e" thereof, the inductance value of the inductor L1A can be set to, for example, zero μH (the inductor L1A is non-connected).

In the present preferred embodiment, it is preferable that the switches 27 are switched over so that inductance values of the respective inductors L1A are substantially equal to each other so as to keep balance between collector currents of IGBTTR1 and IGBTTR2. In addition, when one IPM 3 is used solely, it is preferable not to connect the inductors L1A from viewpoints of electric energy loss. According to the power semiconductor apparatus according to the present preferred embodiment, the inductance value of the inductor L1A can be changed between such cases that one IPM 3 operates solely and that two IPMs 3 operate while being connected in parallel to each other. The power semiconductor apparatus according to the present preferred embodiment, therefore, exhibits such an advantageous effect that it is unnecessary to manufacture another IPM 3.

Modified Preferred Embodiments

In the above-mentioned preferred embodiments described so far, the two IPMs 3 are connected in parallel to each other. Alternatively, three or more IPMs 3 may be connected in parallel to each other.

As described in detail so far, the power semiconductor apparatus according to the present invention is characterized as follows. The power semiconductor apparatus includes power controlling semiconductor modules connected in parallel to each other, each power controlling semiconductor module controlling driving of a power semiconductor device. The power semiconductor apparatus includes a transmission circuit provided in one power controlling semiconductor module and a reception circuit provided in another power controlling semiconductor module. The transmission circuit transmits a predetermined communication signal to another power controlling semiconductor module based on a predetermined activation signal generated by one power controlling semiconductor module. The reception circuit receives the transmitted communication signal, and controls driving control operation of another power controlling semiconductor module based on the received communication signal.

Concretely, the activation signal is a protection alarm signal for protecting the power semiconductor device, the transmission circuit provided in one power controlling semiconductor module transmits the communication signal to another power controlling semiconductor module based on the protection alarm signal generated by the one power controlling semiconductor module. The reception circuit provided in another power controlling semiconductor module receives the transmitted communication signal and stops the driving control operation of another power controlling semiconductor module based on the received communication signal. Therefore, it is possible to stop the driving control operations of both of the power controlling semiconductor modules certainly. Accordingly, a safe operation can be realized in the power semiconductor apparatus.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A power semiconductor apparatus comprising:
a first power controlling semiconductor module for driving a first power semiconductor device; and
a second power controlling semiconductor module for driving a second power semiconductor device,
wherein the first and second power controlling semiconductor modules are connected to each other in parallel,
wherein the first power controlling semiconductor module comprises:
 a first detection protector circuit for generating a first protection alarm signal for protecting the first power semiconductor device;
 a first error signal generator circuit; and
 a first error signal communication circuit,
wherein the second power controlling semiconductor module comprises:
 a second detection protector circuit for generating a second protection alarm signal for protecting the second power semiconductor device;
 a second error signal generator circuit; and
 a second error signal communication circuit,
 wherein, when the first detection protector circuit generates the first protection alarm signal,
 the first error signal generator circuit generates a first error signal based on the first protection alarm signal to stop driving the first power semiconductor device, generates a second error signal, and outputs the second error signal to the first error signal communication circuit;
 the first error signal communication circuit transmits a first communication error signal to the second error signal communication circuit based on the second error signal;
 the second error signal communication circuit receives the first communication error signal, generates a third error signal based on the first communication error signal, and outputs the third error signal to the second error signal generator circuit; and
 the second error signal generator circuit generates a fourth error signal based on the third error signal to stop an operation for driving the second power semiconductor device, and
 wherein, when the second detection protector circuit generates the second protection alarm signal,
 the second error signal generator circuit generates the fourth error signal based on the second protection alarm signal to stop driving the second power semiconductor device, generates a fifth error signal, and outputs the fifth error signal to the second error signal communication circuit;

the second error signal communication circuit transmits a second communication error signal to the first error signal communication circuit based on the fifth error signal;

the first error signal communication circuit receives the second communication error signal, generates a sixth error signal based on the second communication error signal, and outputs the sixth error signal to the first error signal generator circuit; and the first error signal generator circuit generates a seventh error signal based on the sixth error signal to stop an operation for driving the first power semiconductor device.

2. The power semiconductor apparatus as claimed in claim 1, wherein, the first error signal communication circuit generates the first communication error signal and transmits the first communication error signal to the second error signal communication circuit by turning on and off a current generated by a current source;

the second error signal communication circuit receives the first communication error signal by detecting that the current is turned on and off;

the second error signal communication circuit detects a disconnection of a line that connects the first error signal communication circuit to the second error signal communication circuit when the second error signal communication circuit does not detect the current; and the second error signal generator circuit generates the fourth error signal to stop the operation for driving the second power semiconductor device when the second error signal communication circuit detects the disconnection of the line, and wherein, the second error signal communication circuit generates the second communication error signal and transmits the second communication error signal to the first error signal communication circuit by turning on and off the current generated by the current source;

the first error signal communication circuit receives the second communication error signal by detecting that the current is turned on and off;

the first error signal communication circuit detects the disconnection of the line that connects the first error signal communication circuit to the second error signal communication circuit when the first error signal communication circuit does not detect the current; and the first error signal generator circuit generates the seventh error signal to stop the operation for driving the first power semiconductor device when the first error signal communication circuit detects the disconnection of the line.

3. The power semiconductor apparatus as claimed in claim 1, wherein the first power controlling semiconductor module further comprises a first signal communication circuit, wherein the second power controlling semiconductor module further comprises a second signal communication circuit, wherein, the first detection protector circuit outputs the first protection alarm signal to the first signal communication circuit;

the first signal communication circuit transmits the first protection alarm signal to the second signal communication circuit;

the second signal communication circuit receives the first protection alarm signal and outputs the first protection alarm signal to the second detection protector circuit; and the second detection protector circuit generates the second protection alarm signal based on the first protection alarm signal, and wherein, the second detection protector circuit outputs the second protection alarm signal to the second signal communication circuit;

the second signal communication circuit transmits the second protection alarm signal to the first signal communication circuit;

the first signal communication circuit receives the second protection alarm signal and outputs the second protection alarm signal to the first detection protector circuit; and the first detection protector circuit generates the first protection alarm signal based on the second protection alarm signal.

4. The power semiconductor apparatus as claimed in claim 2, wherein the first power controlling semiconductor module further comprises a first signal communication circuit, wherein the second power controlling semiconductor module further comprises a second signal communication circuit, wherein, the first detection protector circuit outputs the first protection alarm signal to the first signal communication circuit;

the first signal communication circuit transmits the first protection alarm signal to the second signal communication circuit;

the second signal communication circuit receives the first protection alarm signal and outputs the first protection alarm signal to the second detection protector circuit; and the second detection protector circuit generates the second protection alarm signal based on the first protection alarm signal, and wherein, the second detection protector circuit outputs the second protection alarm signal to the second signal communication circuit;

the second signal communication circuit transmits the second protection alarm signal to the first signal communication circuit;

the first signal communication circuit receives the second protection alarm signal and outputs the second protection alarm signal to the first detection protector circuit; and the first detection protector circuit generates the first protection alarm signal based on the second protection alarm signal.

* * * * *